United States Patent
Bienek et al.

(10) Patent No.: US 7,180,380 B2
(45) Date of Patent: Feb. 20, 2007

(54) ZONED THERMAL MONITORING

(75) Inventors: Michael D. Bienek, Austin, TX (US);
Larry Hewitt, Austin, TX (US);
Huining Liu, Austin, TX (US)

(73) Assignee: Advanced Micro Devices, Inc.,
Sunnyvale, CA (US)

( * ) Notice: Subject to any disclaimer, the term of this patent is extended or adjusted under 35 U.S.C. 154(b) by 112 days.

(21) Appl. No.: 11/110,379

(22) Filed: Apr. 20, 2005

(65) Prior Publication Data

US 2006/0238267 A1    Oct. 26, 2006

(51) Int. Cl.
*G01K 7/00* (2006.01)
*G01K 1/08* (2006.01)

(52) U.S. Cl. .......................... 331/66; 331/57; 374/141; 377/25; 702/130; 702/132

(58) Field of Classification Search ................ 331/46, 331/57, 66; 374/141; 377/25; 702/130, 702/132
See application file for complete search history.

(56) References Cited

U.S. PATENT DOCUMENTS 5,563,928 A   10/1996  Rostoker et al.
6,067,508 A    5/2000  Conn, Jr.
7,044,633 B2 *  5/2006  Clabes et al. .................. 374/1
2002/0173930 A1  11/2002  Perner
2004/0135643 A1   7/2004  Clabes et al.
2006/0038626 A1   2/2006  Duval et al.

FOREIGN PATENT DOCUMENTS

DE    101 14 825 C1   10/2002
EP    1 262 755 A1    12/2002

* cited by examiner

*Primary Examiner*—David Mis
(74) *Attorney, Agent, or Firm*—Zagorin O'Brien Graham LLP

(57) ABSTRACT

An integrated circuit includes a first temperature sensing device providing an indication of a sensed temperature, a correlation oscillator circuit positioned adjacent to the first temperature sensing device, a plurality of other oscillator circuits, and storage locations storing calibration factors associated with at least the first temperature sensing device and the plurality of other oscillator circuits. A temperature calculation circuit determines temperatures of various locations in the integrated circuit. Each of the temperatures is determined according to an oscillation frequency of a respective one of the other oscillators, the oscillation frequency of the correlation ring oscillator, the temperature of the first temperature sensing device, and one or more stored calibration factors.

27 Claims, 3 Drawing Sheets

ZONED THERMAL MONITORING

BACKGROUND

1. Field of the Invention

This invention relates to integrated circuit circuits and more particularly to thermal monitoring of integrated circuits.

2. Description of the Related Art

Integrated circuits have typically measured temperature at a single point on an integrated circuit die, often using an analog (diode) structure. That one measured temperature was considered to be representative of the entire die area. However, in integrated circuits such as microprocessors the geometries utilized in the integrated circuit have decreased, speed has increased and power utilization has increased. The area around regions that are densely populated with switching transistors tends to be much hotter than the average die temperature resulting in a thermal gradient across the die. In fact areas of the die can be 25° C. hotter than other areas of the die in 130 nm technology at 90 W. The thermal gradient will be even greater as geometries continue to decrease and power densities increase.

If the temperature of an integrated circuit, or a portion of an integrated circuit, rises above a certain maximum temperature, damage can result.

SUMMARY

Thus, it is desirable to be able to detect when certain zones of the integrated circuit die are much hotter than others in order to help ensure that the integrated device remains below a certain maximum temperature. Accordingly, in one embodiment an integrated circuit includes a first temperature sensing device and a first oscillator circuit positioned adjacent to the first temperature sensing device and at least one additional oscillator circuit. A temperature of a region of the integrated circuit associated with the additional oscillator circuit is determined as a function of an oscillation frequency of the additional oscillator circuit and an oscillation frequency of the first oscillator circuit. In an embodiment, a temperature determined by the first temperature sensing device is utilized in determining the temperature of the region associated with the additional oscillator circuit. The integrated circuit may further include a storage location storing one or more calibration factors utilized in determining the temperature of the region associated with the additional oscillator circuit. One of the calibration factors may be used to account for a location of the additional oscillator circuit with respect to a local high temperature region of the integrated circuit. One of the calibration factors may be used to calibrate the temperature reported by the first temperature sensing device. One of the calibration factors may be used for calibrating the additional oscillator according to power utilization of the integrated circuit. In an embodiment, the integrated circuit includes a counter circuit coupled to determine a count value corresponding to the oscillation frequency of the additional oscillator circuit. The count value may be determined by counting a number of cycles of a reference clock occurring in a predetermined number of additional oscillator cycles. The temperature of the region of the integrated circuit associated with the additional oscillator circuit is determined independently of a frequency of the reference clock.

In another embodiment, a method is provided that includes determining respective temperatures at a plurality of locations in an integrated circuit as a function of respective oscillation frequencies of a plurality of temperature sensitive oscillator circuits on the integrated circuit, an oscillation frequency of a correlation oscillator circuit on the integrated circuit, and calibration factors stored by the integrated circuit. The temperatures may be determined additionally as a function of a temperature sensing circuit supplying an indication of a detected temperature, the temperature sensing circuit being located adjacent to the correlation oscillator circuit. In an embodiment, the calibration factors may include a calibration factor to calibrate the temperature detected by the temperature sensing circuit, and a calibration factor to account for a distance from respective oscillator circuits to respective localized high temperature regions of the integrated circuit.

An embodiment of the invention may provide a method of making an integrated circuit having temperature detection capability. Such a method includes storing in nonvolatile memory in the integrated circuit a calibration factor used in determining a temperature associated with oscillations of an oscillator circuit on the integrated circuit, the calibration factor calibrating for a distance of the oscillator circuit from a localized high temperature region of the integrated circuit. The calibration factor may further account for power utilization of the integrated circuit. The method of making an integrated circuit may further include storing the calibration factor by programming one or more nonvolatile locations according to the calibration factor. The method may further include storing in nonvolatile memory in the integrated circuit a plurality of additional calibration factors used in determining a temperature associated respectively with oscillations of a plurality of additional oscillator circuits on the integrated circuit, the calibration factors indicative of a distance respective oscillator circuits are from respective high temperature regions of the integrated circuit that have higher temperatures when operational than other regions of the integrated circuit, as well as being indicative of power utilization of the integrated circuit.

An embodiment of the invention may provide an integrated circuit that includes a plurality of ring oscillators; and information encoded in nonvolatile memory May be indicative of a distance of respective ring oscillator circuits from respective high temperature regions of the integrated circuit, the information used in determining temperatures detected by the ring oscillators. That information may also incorporate information relating to power utilization of the integrated circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
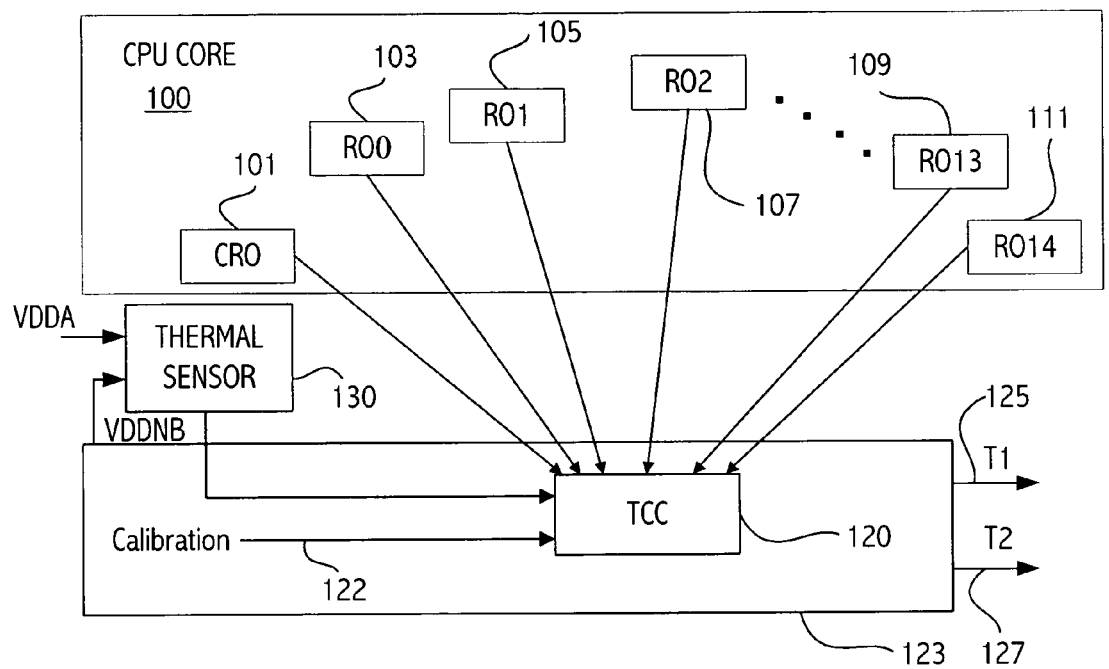
FIG. 1 illustrates an exemplary thermal monitoring architecture for a microprocessor according to an embodiment of the invention.

Referring to FIG. 1, illustrated is an exemplary thermal architecture for a microprocessor according to an embodiment of the invention. The microprocessor includes the CPU core 100. The CPU core 100 includes a plurality of ring oscillators whose oscillation frequency is used to determine temperatures of regions of the CPU core adjacent to the ring oscillators. The thermal architecture includes a correlation ring oscillator (CRO) 101 and ring oscillators (RO) 103–111. In the illustrated embodiment there are 15 ring oscillators (RO0–RO14) in addition to the correlation ring oscillator CRO 101. Other embodiments may have more or less ring oscillators. The ring oscillators RO0–RO14 are disposed in various locations in the CPU core in order to measure the temperature at a variety of locations in the integrated circuit. Large thermal gradients may be present on the die. For example, regions of the die may differ by, e.g., 50° C. Thermal energy spreads relatively slowly and therefore it can take hundreds of milliseconds to propagate to the edge of the die where the thermal diode (used as the temperature sensor in prior art solutions) was typically located. By placing the ring oscillators at various locations in the die, the oscillators can be in closer proximity to critical thermal regions of the integrated circuit. Closer proximity decreases the time to detection of a localized high temperature and a potentially harmful event, allowing better protection of the die. Faster and more precise thermal monitoring also allows reducing the amount of guard-band required in reporting temperature. That allows higher speed devices to be sold. In addition, more accurate observation of the true maximum temperature on the die allows heat sink fans to be controlled more precisely, leading to decreasing fan noise, which is a recognized problem in the industry.

In order to minimize the real estate allocated to the ring oscillators, they may be placed within a clock distribution grid.

The ring oscillators are coupled to a temperature calculation circuit (TCC) 120 that calculates the temperature detected by the various ring oscillators. The TCC 120 also receives stored calibration values on node 122. In one embodiment the calibration values are stored in non-volatile memory such as programmed fuses. An analog thermal sensing device 130 is implemented, e.g., as a diode based temperature sensor providing an indication of temperature as a current. In one embodiment the thermal sensing device utilizes a bandgap circuit, a first order sigma delta modulator and an eight bit digital counter. The thermal sensing device 130 is placed next to the correlation ring oscillator (CRO) 101. The CRO 101 oscillation frequency represents the temperature of the thermal sensing device 130.

Figure 2:
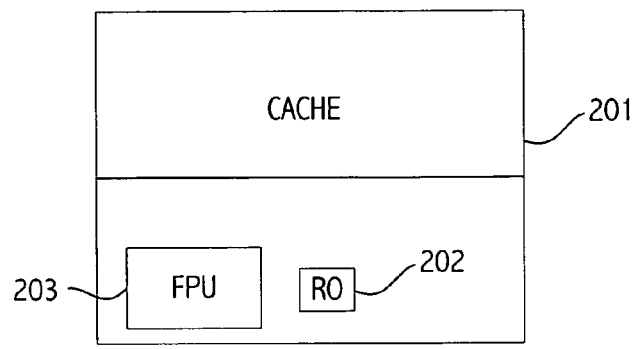
FIG. 2 illustrates an exemplary embodiment of an integrated circuit that includes a floating point unit (FPU) that acts as a local hotspot for a nearby oscillator.

The temperature calculated for each RO is a function of the temperature reported by the thermal sensing device 130, the RO frequency and the CRO frequency. Calibration factors are provided to calibrate the temperature reported by the thermal sensing device 130. In addition, calibration factors are provided to calibrate each of the ROs to account for inaccuracies associated with the circuit and temperature differences between the ROs and local high temperature regions (hot spots) of the integrated circuit. That temperature difference is based on the distance of the RO from the local hot spot as well as the power used by the integrated circuit. Referring to FIG. 2, the integrated circuit shown is a microprocessor that includes a cache 201 and a floating point unit (FPU) 203. An RO 202 is located near the FPU 203, which will have a high number of transistors switching as compared to the cache and thus will be a hot spot for RO 202. In some embodiments the distance of the RO 202 is used to calibrate the temperature determined by RO 202. That ensures that the RO 202 reports the higher temperature of the FPU (the local hot spot) near the RO 202 rather than the lower temperature of the region immediately adjacent to the RO 202. In addition, the calibration factors may also reflect the power consumed by the integrated circuit. Thus, the calibration factor will cause a higher temperature to be reported for a local hot spot in a high power consumption chip, as compared to the same oscillator and hot spot in a lower power consumption chip.

As is well known in the art, process and voltage variations can result in a significant difference in power consumption and speed due to such factors as leakage current, threshold voltages, etc. Such differences result in wide variations in temperature for otherwise identical integrated circuits. In one embodiment, the period of the RO is expected to vary from 24.8 ns at 0 degrees C. to 35.5 ns at 120 degrees C. in the fast process-voltage corner and 129.2 ns at 0 degrees C. to 178.4 ns at 120 degrees C. in the slowest process-voltage corner. The ratio of the period at 120 degrees to the period at 0 degrees (P120/P0) is stable over voltage. The TCC calculation uses the ratio and since the ratio varies with process, that ratio value is stored, e.g., fused.

Figure 3:
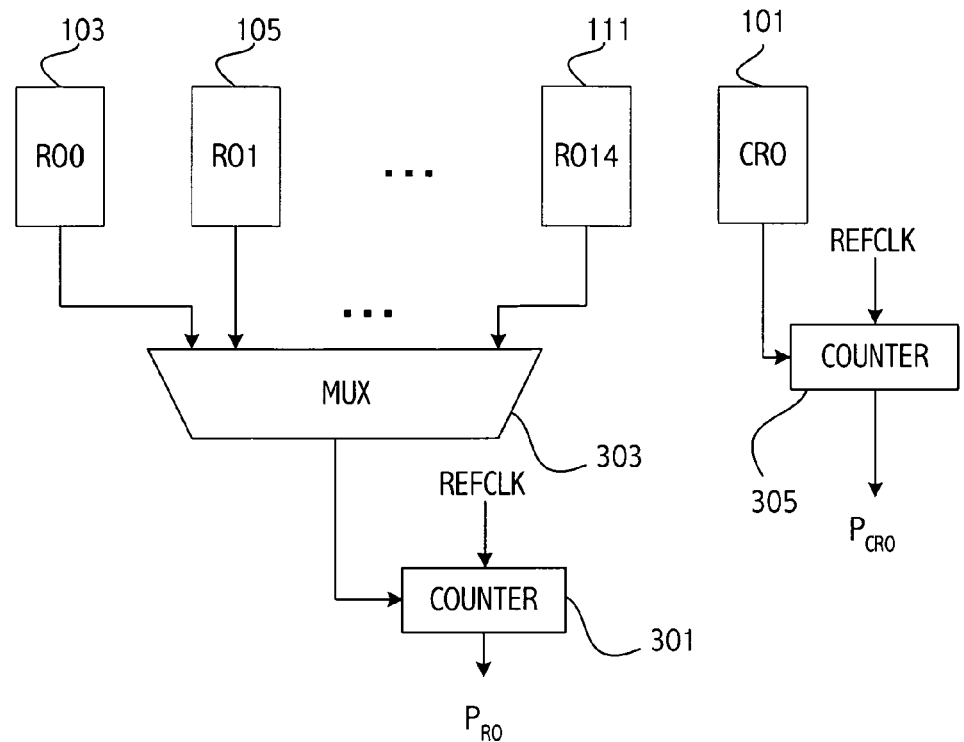
FIG. 3 illustrates an exemplary portion of thermal calculation circuit.

Referring again to FIG. 1, the TCC logic block 120 determines the period of each CRO/RO by counting the number of reference clock cycles during a predetermined number of CRO/RO cycles. The reference clock may be any appropriate clock available in the integrated circuit. In one embodiment, that predetermined number is 1024 CRO/RO cycles. Referring to FIG. 3, an exemplary high level block diagram of a portion of TCC 120 is illustrated having a counter 301 that may be used to count the number of reference clock cycles occurring in 1024 RO oscillation cycles for all of the ROs sequentially. A selector circuit 303 is used to select which of the ROs to evaluate. The embodiment shown in FIG. 3 can count the cycles of an RO and the CRO simultaneously.

The TCC periodically evaluates the temperature of each of the ROs and the CRO. In one embodiment, a TCC cycle includes determining a temperature of each active RO and updating the reported temperature based on the maximum temperature of all the active ROs. An RO may be determined to be active based on a stored control value, e.g., a fuse setting. If an RO is inactive, it may be skipped over in the TCC cycle. In one embodiment, with all 15 ROs active, and with the variations in period in the various process corners, the TCC cycle time can vary from 381 microseconds to 2.74 milliseconds.

The temperature (T(ro)) detected by each RO can be calculated as: $T(ro)=(((P(ro)-P(cro))/P(cro))*(RoConst+T(ts)+F(ro))$, where P(cro) is the number of reference clock cycles that are counted during 1024 CRO cycles; P(ro) is the number of reference clock cycles that are counted during 1024 RO cycles; T(ts) is the temperature reported by the thermal sensing device adjusted by an offset; F(ro) is an offset provided for an RO in −8 to +20, in 2-degree resolution; and $RoConst=120/(R-1)$, with $R=P120/P0$ (the ratio of the period of an RO at 120 degrees versus 0 degrees). Note that the temperature calculation circuit is implemented in one embodiment in hardware. However, other embodiments may be implemented in software or a combination of hardware and software. Note that because the temperature is determined in part as a ratio (P(ro)−P(cro))/P(cro), the temperature of the RO can be determined independently of the frequency of the reference clock that is counted during the 1024 RO/CRO cycles.

Calibration factors may be determined for each individual part, or across a particular group of parts. Appropriate calibration factors may be determined during testing of the integrated circuit. That testing may be performed after packaging. For example, a calibration factor for the thermal sensor 130 may be determined based on the temperature detected by the thermal sensor 130 as compared to a measured temperature. The calibration factor F(ro) can account for the distance of an RO from a local hotspot, inaccuracies in the oscillator circuit (RO variation with process), and power. While the distance may be constant from lot to lot, the power consumption may vary widely. An integrated circuit in the slow process corner may consume 20 W, while an integrated circuit in the fast process corner may consume 100 W. Thus, the offset value (F(ro) can account both for the distance to a local hot spot, as well as how large that offset should be based on the expected power consumption of the component. Thermal simulations can set expectations for gradient based on distance as a function of power. Since power is easily measured on automatic test equipment, tables generated by the thermal simulation can be used to obtain the calibration offset, once the power is known.

The calibration factor RoConst, described above, may be empirically determined. RoConst may be determined based on the integrated circuit power consumption since power is an indicator of process. Alternatively, the CRO could be used to measure the value of RoConst.

Once the calibration factors are known, the offsets may be stored into non-volatile memory in the integrated circuit to complete the manufacturing process of the integrated circuit. That may be accomplished by programming fuses or utilizing other one time programmable memory structures or even other non-volatile memory such as flash memory or other types of EEPROM.

The temperatures detected by TCC 120 may be used for various thermal control functions within the system. Referring again to FIG. 1, logic 123 associated with the TCC 120 may be used to process and/or store temperature values associated with TCC function and supply those values for appropriate thermal control. For example, logic 123 may supply values T1 125 and T2 127. In one embodiment T1 is a processor temperature control value that specifies processor cooling relative to the point at which the system should supply the maximum cooling for the processor's specified maximum case temperature and maximum thermal power dissipation. T1 may be a temperature value adjusted by a stored value (e.g., a fused value) that varies from part to part and/or a constant. The value of T1 may be used to turn on hardware thermal control (e.g., clock throttling), fans, and/or other cooling devices, or to cause temperature alarms where appropriate. In one embodiment T2 is a temperature value, e.g., the highest temperature detected by the TCC. In one embodiment, the temperature is adjusted by a constant. In another embodiment, T2 is the highest temperature detected without adjustment. In other embodiments, one or more actual or adjusted temperature values may be supplied in addition to or instead of T1 and T2. For example, all temperatures detected by TCC may be made accessible by logic 123 to be read by an external interface.

Note that the TCC logic may reside on a different power plane than the ring oscillators. That helps ensure that temperature can be reported off-chip even when the CPU power plane is in a power savings mode that could potentially prevent communication of thermal information. In an embodiment, the ring oscillators have their own power plane separate from the core power plane. A separate ring oscillator power plane has less noise and therefore is less susceptible to any error from voltage sag on the core plane. Having a separate power plane enables the ring oscillators to continue to run while the core shuts down or drops to a different lower power state. The ring oscillator power plane is preferably derived/regulated on-chip from the I/O voltage so it does not require extra pins. The I/O voltage can be used for the TCC logic.

Figure 4:
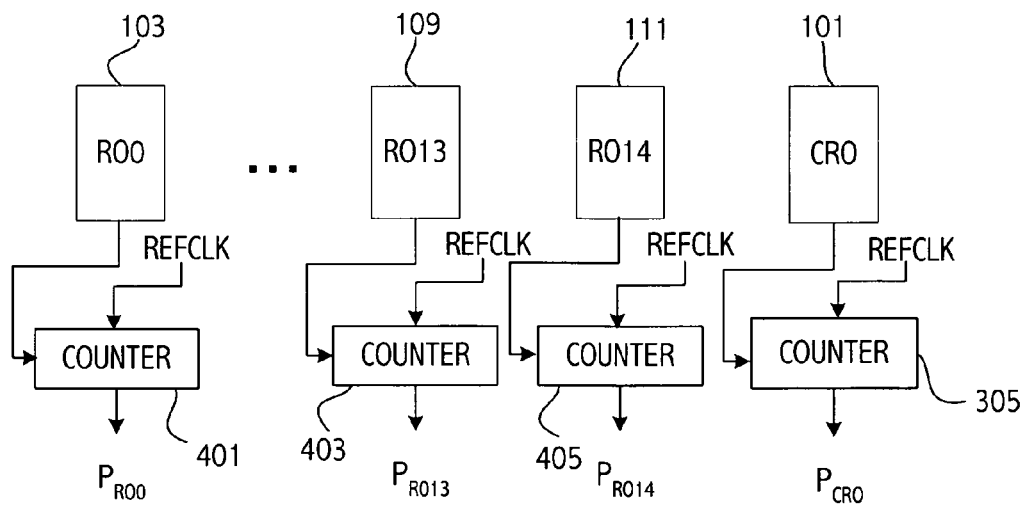
FIG. 4 illustrates an embodiment in which separate counters are provided for each ring oscillator (RO) circuit and the correlation ring oscillator (CRO) circuit.

Referring to FIG. 4, in another embodiment, separate counters are provided for each RO circuit and the CRO circuit. In that way thermal information from approximately the same time period can be determined and a profile can be built of the thermal gradient across the chip. In addition, the time to detection of a thermal event requiring some sort of cooling action, such as turning on fans, throttling, lowering voltage and/or clock frequency, can be reduced even further if the ROs are monitored in parallel. The values from each counter can then be used to determine the temperature associated with the particular RO using the stored calibration factors. Note that the counters may be located in the CPU core with the ROs or may be located elsewhere.

Although the TCC is somewhat stable across voltage, there is a risk that the calculated temperature will jump if VDD is changing during a TCC cycle. VDD may be changing during a power state change to provide for thermal control and/or power consumption control. To mitigate that affect, in one embodiment, the TCC allows the reported temperature to vary by no more than one degree per TCC cycle. However, the first TCC cycle after a cold boot is not constrained in that way. Instead the temperature calculated by the first TCC cycle becomes the first Tj value.

In the thermal architecture described herein, the effects of process variations are compensated for with calibration values (offsets) stored in non-volatile memory such as fuses. However, variations in the supply voltage may affect operation of the RO and that variation may not be accounted for in the stored offsets. Accordingly, the operation of each RO, and thus the accuracy of the reported temperature, may be affected by variations in the supply voltage.

Figure 5:
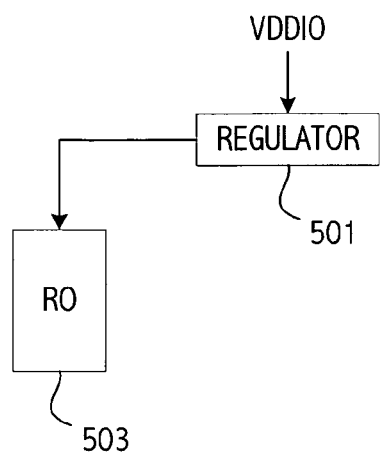
FIG. 5 illustrates a high level block diagram of an embodiment in which a voltage regulator is placed between the supply voltage and the RO.

In order to reduce possible variations in the power supply, in an embodiment the ring oscillators have their own power plane separate from the CPU power plane. A separate ring oscillator power plane has less noise and therefore is less susceptible to any error from voltage sag on the core plane. Having a separate power plane also enables the ring oscillators to continue to run while the core shuts down or drops to a different lower power state. The ring oscillator power plane is preferably derived/regulated on-chip from the I/O voltage so it does not require extra pins as shown. Thus, in one embodiment shown in FIG. 5 a voltage regulator 501 is placed between the supply voltage VDDIO being supplied to the input/output (I/O) portion of the integrated circuit and the RO 503 to ensure that a constant supply voltage is provided to the ring oscillator to substantially eliminate the effects of VDD variations. Note that the TCC logic may also reside on a different power plane than the CPU power plane. For example, the I/O voltage can also be used as the supply for the TCC logic. That helps ensure that temperature can be reported off-chip even when the CPU power plane is in a power savings mode that could potentially prevent communication of thermal information.

Figure 6:
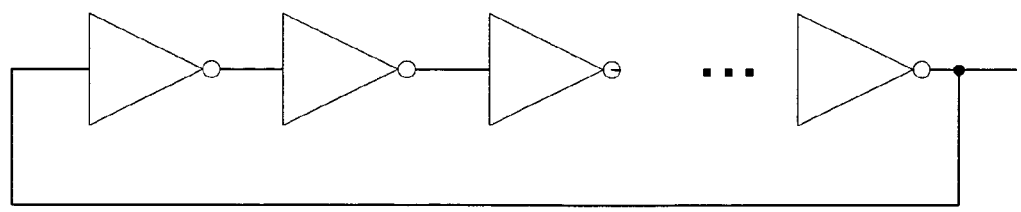
FIG. 6 illustrates a high level block diagram of a ring oscillator structure.

Referring to FIG. 6, a block diagram of an exemplary ring oscillator is shown that may be used for implementing the ring oscillators described herein. However, any combination of digital logic having an odd number of inversions may be used. Note that the ring oscillators should be implemented to maximize the linearity over process, voltage and temperature. For example, the ring oscillators avoid the use of minimum channel length devices to reduce process variation. In an embodiment, maximum channel length devices are used to implement the ring oscillators. In addition, the power supply for the ring oscillators are generated locally to the ring oscillator and distributed in a manner to reduce voltage variation, e.g., from noise sources that may affect the power supply. In addition, a metal resistor and capacitor may be used as loads for each stage of the ring oscillator to increase temperature sensitivity of the ring oscillator. The ring oscillator may include a gating function to disable it during very low power modes.

There are other advantages to utilizing a digital solution to thermal monitoring. A digital solution to thermal monitoring requires less area on the integrated circuit die. Further, the digital solution is more immune to noise as the analog signals could not easily be routed across the IC without picking up noise that could cause inaccuracies in the temperature measurement. Further, fewer pins may be required in certain embodiments as it is easier to multiplex digital signals without degrading signal accuracy.

Thus, various embodiments have been described for thermal monitoring in integrated circuits. The description of the invention set forth herein is illustrative, and is not intended to limit the scope of the invention as set forth in the following claims. For example, while ring oscillators have been described herein, other oscillator circuits whose oscillation frequencies are temperature dependent may also be utilized. Other variations and modifications of the embodiments disclosed herein may be made based on the description set forth herein, without departing from the scope of the invention as set forth in the following claims.

What is claimed is:

1. An integrated circuit comprising:
a first temperature sensing device;
a first oscillator circuit positioned adjacent to the first temperature sensing device;
at least one additional oscillator circuit; and
wherein a temperature of a region of the integrated circuit associated with the additional oscillator circuit is determined, at least in part, as a function of an oscillation frequency of the additional oscillator circuit and an oscillation frequency of the first oscillator circuit.

2. The integrated circuit as recited in claim 1 wherein a temperature determined by the first temperature sensing device is utilized in determining the temperature of the region associated with the additional oscillator circuit.

3. The integrated circuit as recited in claim 1 further comprising a storage location storing one or more calibration factors utilized in determining the temperature of the region associated with the additional oscillator circuit.

4. The integrated circuit as recited in claim 1 wherein one of the calibration factors accounts for a location of the additional oscillator circuit with respect to a local high temperature region of the integrated circuit.

5. The integrated circuit as recited in claim 4 wherein the one of the calibration factors further accounts for power utilization of the integrated circuit.

6. The integrated circuit as recited in claim 1 wherein the first oscillator circuit and the additional oscillator circuit are ring oscillator circuits.

7. The integrated circuit as recited in claim 1 further comprising a counter circuit coupled to determine a count value corresponding to the oscillation frequency of the additional oscillator circuit.

8. The integrated circuit as recited in claim 7 wherein the count value is determined by counting a number of cycles of a reference clock occurring in a predetermined number of additional oscillator cycles.

9. The integrated circuit as recited in claim 8 wherein the temperature of the region of the integrated circuit associated with the additional oscillator circuit is determined independently of a frequency of the reference clock.

10. An integrated circuit as recited in claim 1 wherein the additional oscillator circuit is one of a plurality of other oscillator circuits and the integrated circuit further comprises non volatile storage locations storing calibration factors associated with at least the first temperature sensing device and the plurality of other oscillator circuits.

11. The integrated circuit as recited in claim 10 further comprising at least one temperature calculation circuit coupled to at least one of the other oscillator circuits and configured to determine a temperature, at least in part, according to an oscillation frequency of the at least one oscillator circuit and one or more stored calibration factors.

12. The integrated circuit as recited in claim 10 further comprising a plurality of counter circuits, each of the counter circuits coupled to determine a count value associated with an oscillation frequency of respective ones of the other oscillator circuits.

13. The integrated circuit as recited in claim 11 wherein the temperature calculation circuit is further coupled to the other oscillator circuits through a selector circuit to determine respective values associated with respective oscillation frequencies of each of the other oscillator circuits.

14. The integrated circuit as recited in claim 10 wherein the oscillator circuits are ring oscillators and the first temperature sensing device is comprised of at least one diode.

15. The integrated circuit as recited in claim 10 wherein the plurality of other oscillator circuits measure temperatures of a first integrated circuit region, the other oscillator circuits being coupled to a first power plane separate from a second power plane supplying power to the first integrated circuit region.

16. A method comprising:
determining respective temperatures at a plurality of locations in an integrated circuit as a function, at least in part, of respective oscillation frequencies of a plurality of temperature sensitive oscillator circuits on the integrated circuit, an oscillation frequency of a correlation oscillator circuit on the integrated circuit, and calibration factors stored by the integrated circuit.

17. The method as recited in claim 16 wherein the temperatures are determined additionally as a function of a temperature of a temperature sensing circuit supplying an indication of a detected temperature, the temperature sensing circuit being located adjacent to the correlation oscillator circuit.

18. The method as recited in claim 17, wherein the calibration factors comprise a calibration factor to calibrate the temperature detected by the temperature sensing circuit.

19. The method as recited in claim 16, wherein the stored calibration factors account for a distance from respective oscillator circuits to respective localized high temperature regions of the integrated circuit.

20. The method as recited in claim 16 wherein the stored calibration factors include a calibration factor that is associated with a ratio of a period of an oscillator cycle at a first temperature and at a second temperature.

21. The method as recited in claim 19 wherein the calibration factor further accounts for power utilization of the integrated circuit.

22. The method as recited in claim 16 wherein determining the frequency of each of the oscillator circuits comprises counting a number of cycles of a reference clock occurring in a predetermined number of cycles of each of the oscillator circuits.

23. The method as recited in claim 22 further comprising determining the temperatures independently of a frequency of the reference clock.

24. The method as recited in claim 16 further comprising determining sequentially values corresponding to a temperature of each oscillator circuit.

25. The method as recited in claim 16 further comprising determining in parallel, values corresponding to a temperature of each oscillator circuit.

26. The method as recited in claim 16 further comprising determining a maximum temperature value detected by the plurality of oscillator circuits and storing the maximum temperature value in a storage location accessible by an external interface.

27. An integrated circuit comprising:

means for determining a first value indicative of an oscillation frequency of a calibration oscillator disposed on the integrated circuit;

means for determining second values indicative of an oscillation frequency of respective oscillator circuits disposed on the integrated circuit; and means for determining a temperature associated with each of the second oscillator circuits according to, at least in part, the first value and respective second values.

* * * * *